United States Patent
Buvid et al.

(10) Patent No.: US 9,875,958 B1
(45) Date of Patent: Jan. 23, 2018

(54) TRACE/VIA HYBRID STRUCTURE AND METHOD OF MANUFACTURE

(71) Applicant: INTERNATIONAL BUSINESS MACHINES CORPORATION, Armonk, NY (US)

(72) Inventors: Daniel J. Buvid, Rochester, MN (US); Eric J. Campbell, Rochester, MN (US); Sarah K. Czaplewski, Rochester, MN (US); Christopher W. Steffen, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/347,292

(22) Filed: Nov. 9, 2016

(51) Int. Cl.
H05K 1/11 (2006.01)
H01L 23/498 (2006.01)
H01L 21/48 (2006.01)

(52) U.S. Cl.
CPC ...... *H01L 23/49838* (2013.01); *H01L 21/486* (2013.01); *H01L 23/49816* (2013.01); *H01L 23/49827* (2013.01)

(58) Field of Classification Search
CPC ..... H01L 21/00; H01L 21/206; H01L 21/486; H01L 21/768; H01L 23/52; H01L 23/535; H01L 23/49816; H01L 23/49827
USPC ...... 174/264; 427/97.7, 97.8, 123, 124, 301; 205/123, 157; 257/751, 758, E21.175, 257/E21.577, E21.584
See application file for complete search history.

(56) References Cited

U.S. PATENT DOCUMENTS

| | | |
|---|---|---|
| 5,585,675 A | 12/1996 | Knopf |
| 6,774,315 B1 | 8/2004 | Pierson et al. |
| 7,274,105 B2 | 9/2007 | Fairchild et al. |
| 8,322,031 B2 | 12/2012 | Chong et al. |
| 8,916,232 B2 * | 12/2014 | Yoon .................... H01L 21/0206 427/301 |
| 2005/0139390 A1 | 6/2005 | Kim et al. |
| 2005/0251777 A1 | 11/2005 | Bartley et al. |
| 2006/0049056 A1 * | 3/2006 | Wang ..................... C25D 3/02 205/123 |
| 2009/0304914 A1 * | 12/2009 | Nalla ..................... C23C 16/18 427/124 |

(Continued)

FOREIGN PATENT DOCUMENTS

JP 2009-071157 A 4/2009

*Primary Examiner* — Xiaoliang Chen
(74) *Attorney, Agent, or Firm* — Tutunjian & Bitetto, P.C.; Robert R. Williams

(57) ABSTRACT

A method of forming an interconnect that includes providing a sacrificial trace structure using an additive forming method. The sacrificial trace structure having a geometry for the interconnect. The method continuous with forming a continuous seed metal layer on the sacrificial trace structure; and removing the sacrificial trace structure, wherein the continuous seed metal layer remains. An interconnect metal layer may be formed on the continuous seed layer. A dielectric material may then be formed on the interconnect metal layer to encapsulate a majority of the interconnect metal layer, wherein ends of the interconnect metal layer are exposed through one surface of the dielectric material to provide an interconnect extending into a dielectric material.

11 Claims, 9 Drawing Sheets

(56) References Cited

U.S. PATENT DOCUMENTS

| | | | |
|---|---|---|---|
| 2010/0311236 A1* | 12/2010 | DeHaven | H01L 21/2855 438/653 |
| 2013/0093092 A1* | 4/2013 | Kanki | H01L 23/53238 257/758 |
| 2014/0027908 A1* | 1/2014 | Tsai | H01L 21/76885 257/751 |

* cited by examiner

TRACE/VIA HYBRID STRUCTURE AND METHOD OF MANUFACTURE

BACKGROUND

Technical Field

The present invention generally relates to interconnect structures, and more particularly to forming electrically conductive lines having orthogonal portions and curvatures extending through dielectric structures.

Description of the Related Art

Copper wires and interconnects typically seen in printed circuit board (PCBs), interposers and package substrates. An interposer is a form of interconnect that is placed between a printed circuit board (PCB) and a processor. As chips continue to scale, chips become denser requiring a higher pin count for the input/output (I/O). An interposer is used to spread a connection to a wider pitch or to re-route to a different connection. In conventional interconnect structures that extend through a substrate, the metal lines are limited to being straight.

SUMMARY

In one embodiment, a method of forming an interconnect is described herein that includes providing a sacrificial trace structure using an additive forming method. The sacrificial trace structure has a geometry for the later formed interconnect. The method continuous with forming a continuous seed metal layer on the sacrificial trace structure; and removing the sacrificial trace structure, wherein the continuous seed metal layer remains. An interconnect metal layer may be formed on the continuous seed layer. A dielectric material may then be formed on the interconnect metal layer to encapsulate a majority of the interconnect metal layer. Ends of the interconnect metal layer can be exposed through one surface of the dielectric material to provide an interconnect extending into a dielectric material.

In another embodiment, the method of forming the interconnect may include providing a sacrificial trace structure using an additive forming method; and forming a seed metal layer on the sacrificial trace structure. In a following process step, the method can include removing the sacrificial trace structure, wherein the seed metal layer remains. An interconnect metal layer may then be formed on the continuous seed layer. A dielectric material is formed on the interconnect metal layer to encapsulate a majority of the interconnect metal layer, wherein ends of said interconnect metal layer are exposed to provide said interconnect extending through said dielectric material. A solder bump may be formed on the ends of the interconnect metal layer. Thereafter, the solder bump is bonded to a substrate including at least one microprocessor.

In another aspect, an interposer structure is provided that includes a dielectric base material; and a metal based interconnect structure extending through the dielectric base material from a first side of the dielectric base material to an opposing second side of the dielectric base material. At least one metal line of the metal based interconnect structure is non-linear and extends from the first side of the dielectric base material to said second side of said dielectric base material. In some embodiments, the non-linear metal based interconnect is orthogonal, and in some embodiments the non-linear metal based interconnect includes at least one curvature. Solder connections are present on opposing sides of the dielectric base material. The solder connections are present on the exposed surfaces of said metal based interconnect structure.

These and other features will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1A:
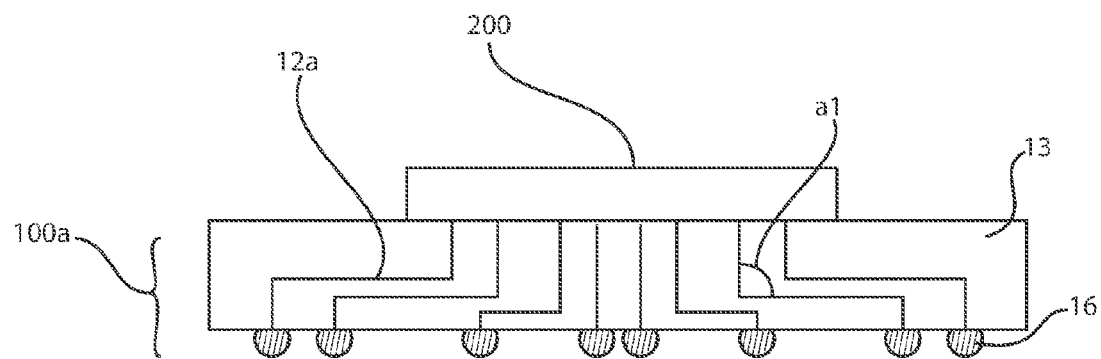
FIG. 1A is a side cross-sectional view depicting one embodiment of an interposer including metal based interconnect structure that includes orthogonal portions.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein provide interconnect structures, and more particularly provide for forming electrically conductive lines having curvatures and orthogonal portions through dielectric structures. Copper wires and interconnects typically seen in printed circuit boards, interposers and package substrates are typically limited to being manufactured in straight horizontal and vertical directions. In some embodiments, the methods and structures disclosed herein manufacture a copper trace, via, pad hybrid structure, including orthogonal and curved pathways. This can allow for shorter interconnect, lower latency and lower impedance in the electrical devices employing the structures and methods described herein.

Figure 1B:
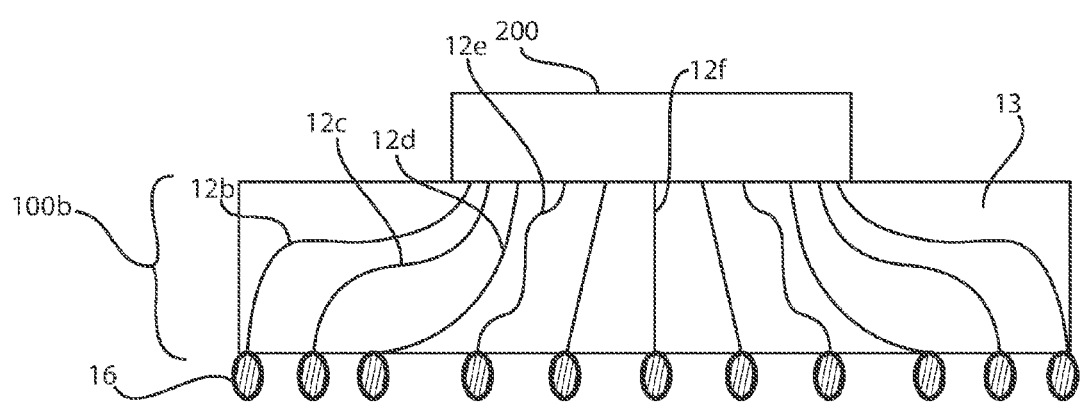
FIG. 1B is a side cross-sectional view depicting one embodiment of an interposer including metal based interconnect structures that include curveted portions.

FIGS. 1A and 1B illustrate some embodiments, of an interposer 100a, 100b which is one example of an interconnect structure within the scope of the present disclosure, that includes a metal based interconnect structure 12a, 12b, 12c, 12d, 12e. In some embodiments, the interposer 100a, 100b includes a dielectric base material, i.e., dielectric body 13, and a metal based interconnect structure 12a, 12b, 12c, 12d, 12e extending through said dielectric base material from a first side of the dielectric base material to an opposing second side of the dielectric base material. At least one metal line of the metal based interconnect structure 12a, 12b, 12c, 12d, 12e extends from the first side of the dielectric base material 13 to the second side of the dielectric base material 13. Still referring to FIGS. 1A and 1B, in some embodiments, solder connections 16, e.g., solder bumps, may be present on opposing sides of the dielectric body 13 on exposed surfaces of said metal based interconnect structure.

In some embodiments, the metal based interconnect structure 12a, 12b, 12c, 12d, 12e extends through the dielectric body 13 to provide for electric communication across the interposer 100a, 100b from a first side of the interposer 100a, 100b that may be in electric contact with a microprocessor 200 to a second side of the interposer 100a, 100b. The second side of the interposer 100a, 100b may be in contact with a supporting substrate (not shown), in which the supporting substrate may include its own interconnect structure that is to be positioned in electrical communication with the metal based interconnect structure 12a, 12b, 12c, 12d, 12e of the interposer 100a, 100b.

The metal based interconnect structure 12a, 12b, 12c, 12d, 12e may be composed of any electrically conductive metal. "Electrically conductive" as used through the present disclosure means a material typically having a room temperature conductivity of greater than $10^5$ (S/m). In some embodiments, the metal based interconnect structure 12a, 12b, 12c, 12d, 12e may be comprised of aluminum (Al), copper (Cu), tungsten (W), tantalum (Ta), platinum (Pt), gold (Au), silver (Ag), tin (Sn), and other elemental metals. In other embodiment, the metal based interconnect structure 12a, 12b, 12c, 12d, 12e may be comprised of metal nitrides, such as tantalum nitride (TaN), titanium nitride (TiN), tungsten nitride (WN), and combinations thereof. The dielectric base material of the dielectric body 13a may be composed of $SiO_2$, $Si_3N_4$, $SiO_xN$, SiC, SiCO, SiCOH, SiCH compounds, carbon doped oxides, inorganic oxides, inorganic polymers, hybrid polymers, organic polymers, polyimides, polyphenylene oxide, organo-inorganic materials, spin-on glasses, silsesquioxane-based materials, diamond-like carbon (DLC), amorphous hydrogenated carbon and combinations thereof.

As noted above, the metal based interconnect structure 12a, 12b, 12c, 12d, 12e includes non-linear portions. Referring to the interposer 100A that is depicted in FIG. 1A, the metal based interconnect structures 12a may include angled portions. For example, linear line portions of the metal based interconnect structure 12a may intersect at orthogonal angles $\alpha 1$, as depicted in FIG. 1A. Orthogonal refers to right angles, i.e., angles of 90°. It is noted that this is only one example of the angle between intersecting linear portions of the metal based interconnect structures 12a. For example, in one embodiment, the angle $\alpha 1$ connecting intersecting liner portions of the metal based interconnect structures 12a may range from 15° to 85°. In other embodiments, the angle $\alpha 1$ connecting intersecting liner portions of the metal based interconnect structures 12a may range from 30° to 60°. In some examples, the angle $\alpha 1$ connecting intersecting liner portions of the metal based interconnect structures 12a may be equal to 15°, 20°, 25°, 30°, 35°, 45°, 55°, 60°, 65°, 70°, 75°, 80°, 85° and 90°.

Referring to the interposer 100B that is depicted in FIG. 1B, the metal based interconnect structures 12b, 12c, 12d, 12e may include curved portions. A curve is a line that is not straight. In some embodiments, the curvature of the metal line of the metal based interconnect structure is a single arc extending continuously from a first side to a second side of the dielectric base material as identified by reference number 12d. In another embodiment, the curvature of the metal based interconnect structure has multiple arcs, as depicted by the structures having reference numbers 12b, 12c, and 12e. For example, the curvature may be sigmoidal. In yet other embodiments, the curvature for the metal lines of the metal based interconnect structures may include a first arc at a first side of the dielectric body 13, and a second arc at a second side of the dielectric body 13A, wherein a linear portion of the metal based interconnect structure is present therebetween, as illustrated by the structure having reference number 12b. In yet another embodiment, the metal based interconnect structure may include metal lines having a "U" shape that exit on only one side of the dielectric body containing the metal based interconnect structure.

It is noted that the angled structures that provide the metal based interconnect structures 12a in FIG. 1A, and the curved structures that provide the metal based interconnect structures 12b, 12c, 12d, 12e, may be employed simultaneously with linear metal lines in the same dielectric body 13. For example, FIG. 1B illustrates linear metal lines identified by reference number 12f.

Although the structure depicted in FIGS. 1A and 1B, is an interposer, the methods and structures disclosed herein are equally applicable to other forms of interconnect structures, as well as printed circuit boards (PCBs) and components related to printed circuit boards (PCBs). Further details of the methods of the present disclosure are now discussed with greater detail with reference to FIGS. 2-14.

Figure 2:
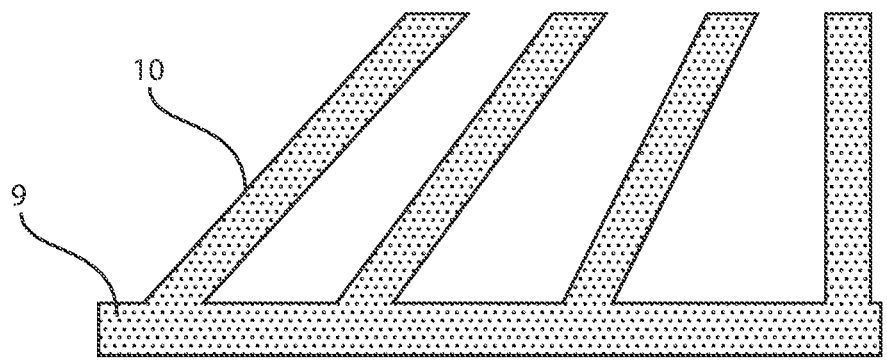
FIG. 2 is a side cross-sectional view depicting providing a sacrificial trace structure using an additive forming method, the sacrificial trace structure having a geometry for the interconnect, in accordance with one embodiment of the present disclosure.

FIG. 2 depicts providing a sacrificial trace structure 10 using an additive forming method. The term 'sacrificial' denotes a structure that facilitates the formation of a material layer within a final device structure, yet the sacrificial structure is not present in the final device structure. The sacrificial trace structure 10 provides a structure having a geometry, e.g., including lines having angles or curvatures, that provides the geometry of the later formed metal lines of the metal based interconnect structures, e.g., the structures identified by reference numbers 12a, 12b, 12c, 12d, 12e in FIGS. 1A and 1B.

Additive Manufacturing (AM) is an appropriate name to describe the technologies that build 3D objects by adding layer-upon-layer of material, whether the material is dielectric, plastic, metal, of semiconductor composition or combination thereof. The sacrificial trace structure 10 is formed using a three dimensional additive manufacturing method selected from the group consisting of stereolithography, self-propagating waveguide formation, fused deposition modeling (FDM), selective laser sintering (SLS), continuous liquid interface production (CLIP), digital light processing (DLP), material jetting, and combinations thereof.

Stereolithography a technique or process for creating three-dimensional objects, in which a computer-controlled moving laser beam is used to build up the required structure, layer by layer, from a liquid polymer that hardens on contact with laser light. In some embodiments, a stereolithography technique provides a method to build a 3D microstructure in a layer-by-layer process, which can involve a platform (e.g., substrate) that is lowered into a photo-monomer bath in discrete steps. At each layer, a laser is used to scan over the area of the photo-monomer that is to be cured (i.e., polymerized) for that particular layer. Once the layer is cured, the platform is lowered by a specific amount (i.e., determined by the processing parameters and desired feature/surface resolution), and the process is repeated until the complete 3D structure is created.

Fused deposition modeling (FDM) is an additive manufacturing technology, which works on an "additive" principle by laying down material in layers; a plastic filament or metal wire is unwound from a coil and supplies material to produce a part. In some embodiments, FDM builds parts up layer-by-layer by heating and extruding thermoplastic filament.

Self-propagating waveguide formation typically includes the use of a polymer foam, or other cellular material. Self-propagating waveguide may for ordered open cellular polymer materials with micro-lattice structures and features. These materials can be formed by exposing a two-dimensional mask with a pattern of circular apertures that is covering a reservoir containing a photomonomer. More specifically, collimated UV light can be used to expose liquid polymer through a mask to form polymer waveguide. Within the photomonomer, self-propagating photopolymer waveguides originate at each aperture in the direction of the UV collimated beam and polymerize together at points of intersection. By simultaneously forming an interconnected array of these fibers in three-dimensions and removing the uncured monomer, three dimensional lattice-based open-cellular polymer materials can be fabricated, In one embodiments, the sacrificial trace structure 10 is comprised of a polymeric material. When the sacrificial trace structure 10 is formed using stereolithography, the sacrificial trace structure 10 can be composed of a photo-hardenable resin compositions comprises of at least one photo-polymerizable compound, such as a photo-polymerizable modified urethane (meth)acrylate compound, an oligoester acrylate compound, an epoxyacrylate compound, an epoxy compound, a polyimide compound, an aminoalkyd compound, and a vinyl ether compound, as a main component, and a photosensitive polymerization initiator. When the sacrificial trace structure 10 is formed using FDM, the sacrificial trace structure 10 can be composed of Acrylonitrile Butadiene Styrene ABS, Polylactic acid PLA, Polycarbonate PC, Polyamide PA, Polystyrene PS, Polyether ether ketone PEEK, lignin, rubber, and combinations thereof. When the sacrificial trace structure 10 is formed using self-propagating waveguide formation, the sacrificial trace structure 10 may be composed of thiol-ene polymer.

It is noted that the above compositions for the sacrificial trace structure 10 and additive manufacturing processes are provided for illustrative purposes and are not intended to limit the disclosed methods and structures to only the above examples. For example, in addition to the above examples, the sacrificial trace structure 10 may also be formed using wire or textile layup, modular assembly, deformed perforated sheet lattice assembly, selective laser sintering (SLS), continuous liquid interface production (CLIP), digital light processing (DLP), material jetting, as well as other three dimensional additive methods.

Although the sacrificial trace structure 10 is depicted as having linear metal line portions, the sacrificial trace structure may include non-linear metal line portions, e.g., angled portions and curved portions, to provide metal interconnect structures similar to the non-linear metal lines of the metal interconnect structures 12a, 12b, 12c, 12d, 12e as depicted in FIGS. 1A and 1B.

Figure 3:
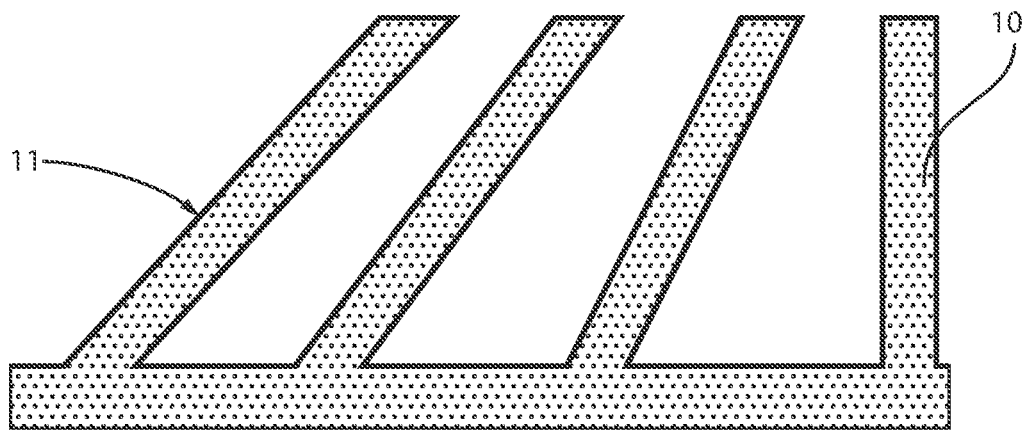
FIG. 3 is a side cross-sectional view depicting forming a continuous seed metal layer on the sacrificial trace structure, in accordance with one embodiment of the present disclosure.

FIG. 3 depicts one embodiment of forming a continuous seed metal layer 11 on the sacrificial trace structure 10. The continuous seed metal layer 11 may be composed of any metal, such as nickel, copper, aluminum, tungsten, titanium, platinum, gold, tin, silver, and combinations thereof. The thickness of the continuous seed metal layer 11 is selected to provide a seed layer for subsequent metal depositions, and have a thickness that is suitable to not be removed during the process step for removing the sacrificial trace structure 10. The continuous seed metal layer 10 is a deposited metal layer having a conformal thickness. The term "conformal" denotes a layer having a thickness that does not deviate from greater than or less than 30% of an average value for the thickness of the layer. By continuous it is meant that the continuous seed metal layer 10 is free of breaks.

The continuous seed metal layer 11 may be deposited using a physical vapor deposition (PVD) process. For example, the continuous seed metal layer 11 may be composed of nickel deposited using electroless plating. Electroless nickel plating (EN) is an auto-catalytic chemical technique used to deposit a layer of nickel-phosphorus or nickel-boron alloy. The process may employ a reducing agent, e.g., hydrated sodium hypophosphite ($NaPO_2H_2.H_2O$) which reacts with the metal ions to deposit metal. In other embodiments, the continuous seed metal layer 11 may be formed using electroplating and/or sputtering. In other embodiments, the continuous seed metal layer 11 may be formed using atomic layer deposition (ALD) or chemical vapor deposition (CVD), e.g., plasma enhanced chemical vapor deposition (PECVD). The thickness of the continuous seed metal layer 11 may have a thickness ranging from 5 nm to 100 µm. In another embodiment, the thickness of the continuous seed metal layer 11 may range from 10 nm to 50 nm. In another embodiment, the thickness of the continuous seed metal layer 11 may range from 1 µm to 100 µm. In some embodiments, the polymeric base material 9 may facilitate uniformity in the deposition of the continuous seed metal layer 11 on the portions of the sacrificial trace structure 10 that subsequently provide the metal lines of the metal interconnect structure of the interposer.

It is noted that in some embodiments a block mask may be formed atop a portion of the sacrificial trace structure 10 prior to forming the continuous seed metal layer 11 to select which portions of the sacrificial trace structure 10 may be coated with the continuous seed metal layer 11.

Figure 4:
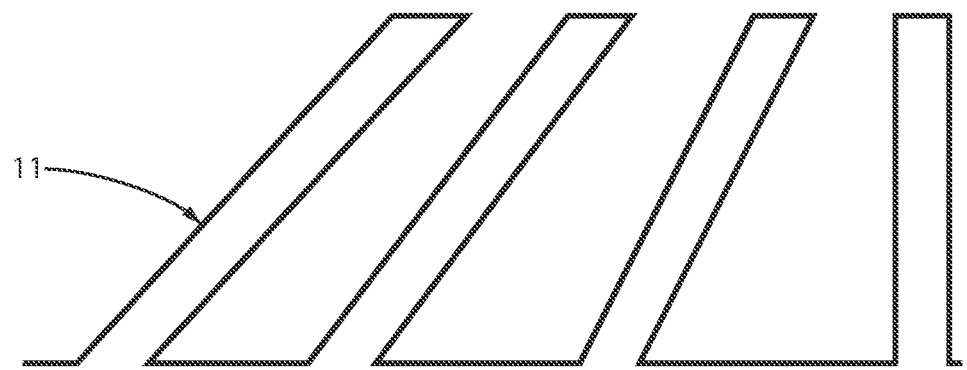
FIG. 4 is a side cross-sectional view depicting one embodiment of removing the sacrificial trace structure, wherein the continuous seed metal layer remains, in accordance with one embodiment of the present disclosure.

FIG. 4 depicts one embodiment of removing the sacrificial trace structure 10, wherein the continuous seed metal layer 11 remains. In some embodiments, the sacrificial trace structure 10 may be removed by dissolving the polymeric material of the sacrificial trace structure 10. In some embodiments, the sacrificial trace structure 10 may be removed by an etch process that is selective to the continuous seed metal layer 11. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The selective etch process may be a wet chemical etch or a dry etch.

Figure 5A:
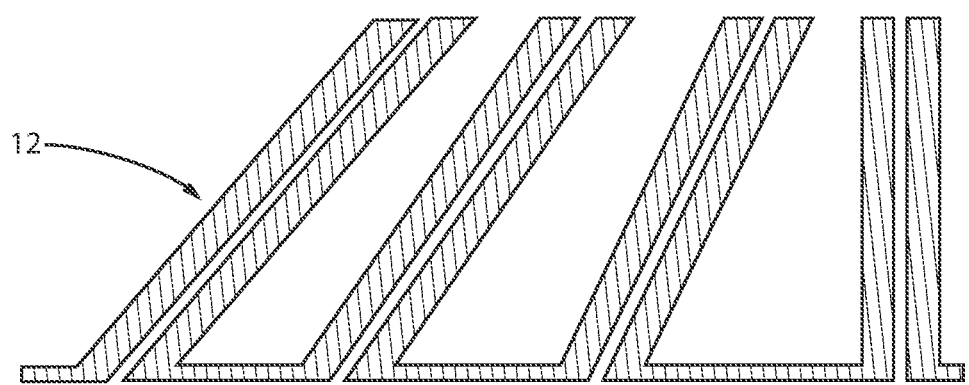
FIG. 5A is a side cross-sectional view depicting one embodiment of forming an interconnect metal layer on the continuous seed layer, wherein the interconnect metal layer is hollow.
Figure 5B:
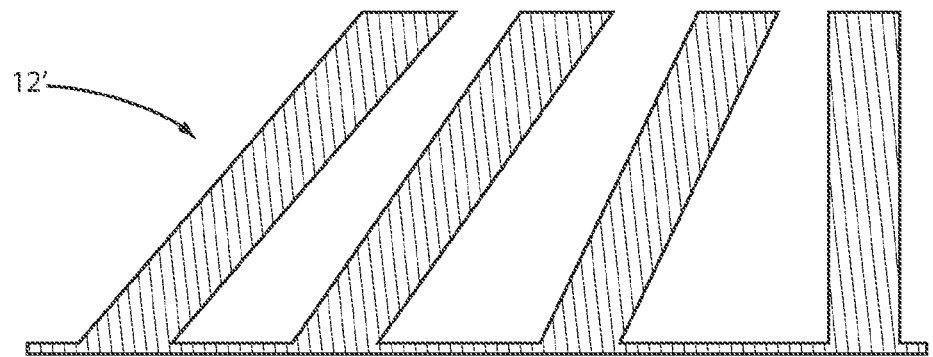
FIG. 5B is a side cross-sectional view depicting one embodiment of forming an interconnect metal layer on the continuous seed layer, wherein the interconnect metal layer is solid.

FIGS. 5A and 5B illustrate one embodiment of forming an interconnect metal layer 12 on the continuous seed metal layer 11. In one embodiment, the interconnect metal layer 12 may be deposited directly on the continuous seed metal layer 11 at a thickness that provides metal lines for the interconnect metal layer 12 that are hollow, as depicted in FIG. 5A. In another embodiment, the interconnect metal layer 12' is deposited directly on the continuous metal seed layer 11 at a thickness to provide solid metal lines for the interconnect metal layer 12 of the interposer, as depicted in FIG. 5B.

The interconnect metal layer 12 may be composed of any metal, such as the metal being deposited provides an electrically conductive material. For example, the interconnect metal layer 12 may be composed of copper, nickel, aluminum, titanium, tungsten, tantalum, platinum, gold, tin, silver and combinations thereof. In some embodiments, the interconnect metal layer 12 may be deposited using a physical vapor deposition (PVD) method, such as sputtering, evaporative deposition, and combinations thereof. In some embodiments, the interconnect metal layer 12 may be deposited using a plating method, such as electrolytic plating, electroless plating, and combinations thereof. In one embodiment, the interconnect metal layer 12 is formed composed of copper deposited using electroplating. One example of a plating bath composition that is suitable for electroplating the interconnect metal layer 12 of copper may include a copper sulfate ($CuSO_4$) solution with sulfuric acid ($H_2SO_4$). In some embodiments, electroless deposition of copper (Cu) may rely on the presence of a reducing agent, for example formaldehyde (HCHO), which reacts with the copper (Cu) metal ions to deposit the metal. In some other embodiments, the metal for the interconnect metal layer 12 may be deposited using a chemical vapor deposition (CVD) process, such as plasma enhanced chemical vapor deposition (PECVD) and metal organic chemical vapor deposition (MOCVD). In yet other embodiments, the metal for the interconnect metal layer 12 may be deposited using atomic layer deposition (ALD).

Figure 6:
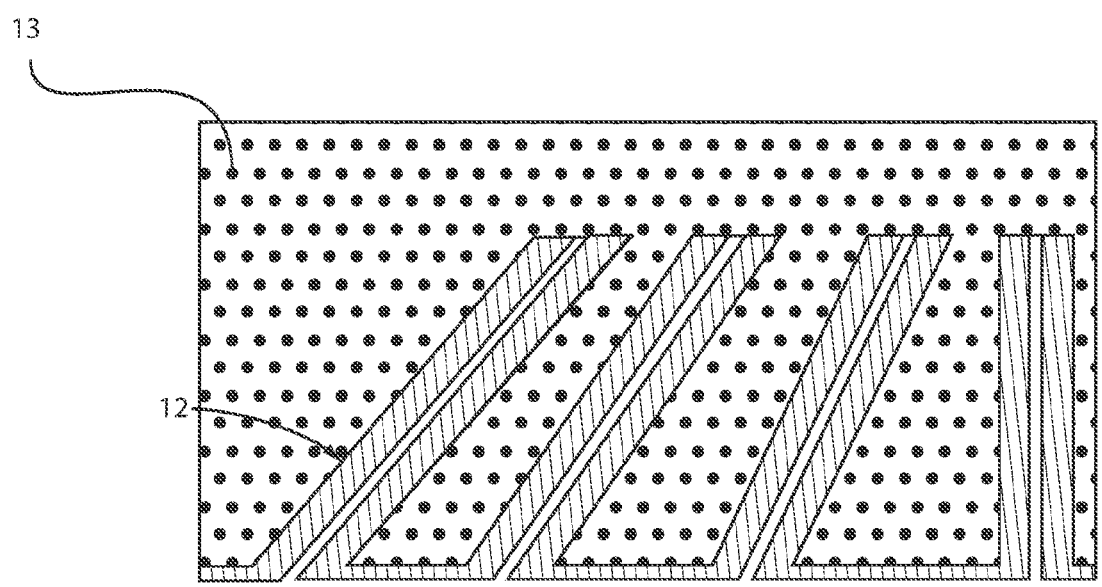
FIG. 6 is a side cross-sectional view depicting a dielectric material may then be formed on the interconnect metal layer to encapsulate a majority of the interconnect metal layer, in accordance with one embodiment of the present disclosure.

FIG. 6 depicts one embodiment of a dielectric material 13 may then be formed on the interconnect metal layer 12 to encapsulate a majority of the interconnect metal layer 12. The dielectric material 13 for encapsulating the interconnect metal layer 12 can be composed of any dielectric or polymeric material that can be deposited in a manner that fills the voids between the adjacent interconnect metal layers 12 and provides the dielectric body 13 of the interposer. In some embodiments, the dielectric material 13 may be an oxide, nitride or oxynitride material. In some examples, the dielectric material 13 may be selected from the group consisting of $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyimides, polyphenylene oxide, or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. The dielectric material 13 may be deposited using spin on deposition, chemical vapor deposition (CVD), injection molding, transfer molding, deposition from solution, and a vacuum may be employed to draw the dielectric material 13 within narrow passageways to ensure that the dielectric material 13 fully encapsulates the interconnect metal layers 12.

Figure 7:
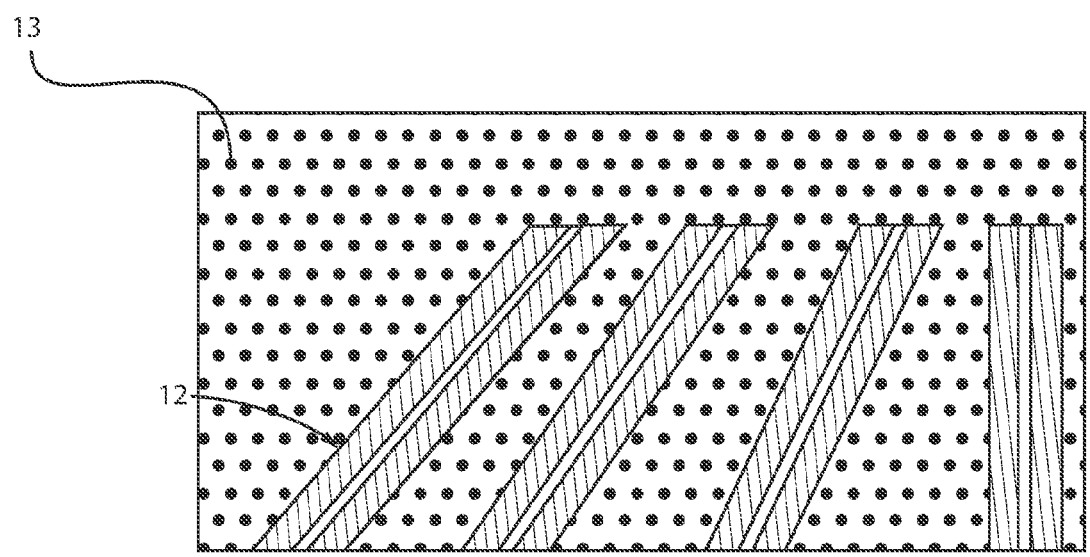
FIG. 7 is a side cross-sectional view depicting planarizing the opposing sidewalls of the structure depicted in FIG. 6.

FIG. 7 planarizing the opposing sidewalls of the structure depicted in FIG. 6. Planarizing exposes the ends of the interconnect metal layers 12 so that the interconnect metal lines extend through the dielectric body 13 and provide points for being engaged in electrical communication to the structures that are engaged to the interposer. The planarization process may be provided by grinding, polishing, chemical mechanical planarization (CMP) or a combination thereof.

Figure 8:
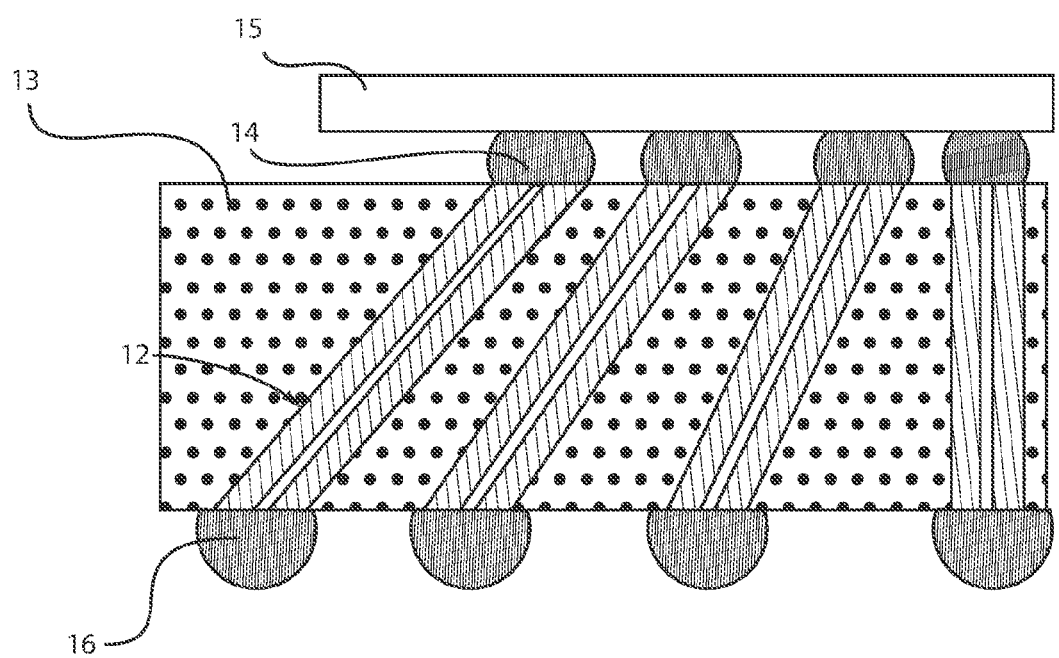
FIG. 8 is a side cross-sectional view depicting solder bump processing of the structure depicted in FIG. 7.

FIG. 8 depicts solder bump processing of the structure depicted in FIG. 7. Solder bumps (also referred to as "solder balls"), such as C4 (controlled collapse chip connection) bumps, have been used to bond a chip to a chip carrier or to a chip to an interposer and then bond the interposer to the chip carrier. The solder bumps/solder balls 14, 16 are formed on the exposed ends of the metal wires that provide the metal interconnect structure 12. The term "solder", as used herein, refers to any metal or metallic compound or alloy that is melted and then allowed to cool in order to join two or more metallic surfaces together. Generally speaking, solders have melting temperatures in the range of 150° C. to 250° C. Solder bumps may be small spheres of solder (solder balls) that are bonded to contact areas, interconnect lines or pads of semiconductor devices. In some embodiments, a pad may be formed on the exposed edge surfaces of the interconnect structure prior to forming the solder, wherein the pad is composed of a material layer that the solder may adhere to. In some embodiments, the solder bumps can be made from lead-free solder mixtures or lead tin solder. The solder bumps 14, 16 may be deposited using injection molded soldering (IMS), solder bumping, or sputtering. In FIG. 8 the structure identified by reference number 15 may be a microprocessor chip.

Figure 9:
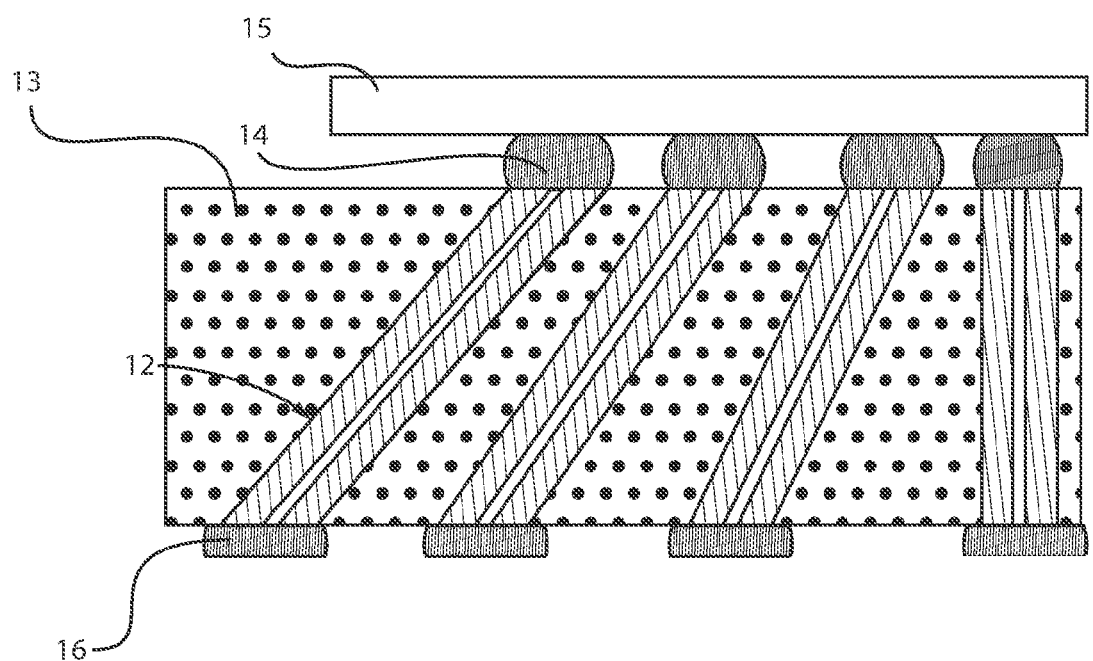
FIG. 9 is a side cross-sectional view depicting forming LGA pads on interconnect metal layers of the structure depicted in FIG. 7.

It is noted that at least one row of solder bumps 14, 16 that is depicted in the structure of FIG. 8 may be omitted. FIG. 9 depicting substituting one row of solder bumps with a land grid array (LGA). The land grid array (LGA) is a type of surface-mount packaging for integrated circuits (ICs) that is notable for having the pins on the socket (when a socket is used) rather than the integrated circuit. The LGA pads may be soldered to the exposed surfaces of the metal interconnect structure 12. In some embodiments, the LGA pads may be formed using a photolithography and plating operation.

Figure 10:
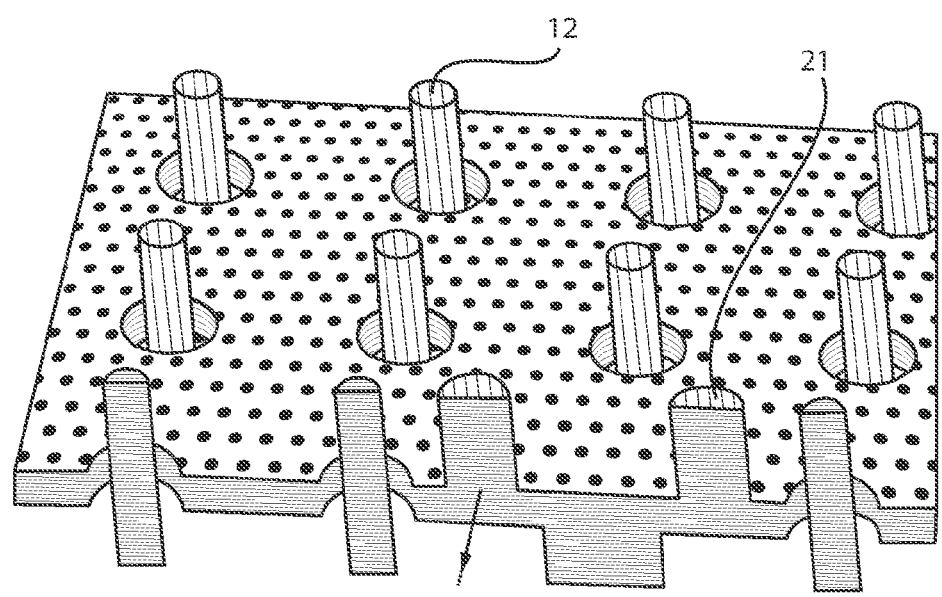
FIG. 10 is a side cross-sectional view depicting a planar structure in which the initial wiring structures were formed using additive manufacturing, in which the planar structure includes grounding wires.

The disclosed method for producing trace/via hybrid structures depicted in FIGS. 1-9 can also be used to manufacture planes in interconnect structures. FIG. 10 depicts a planar structure, in which the initial wiring structures were formed using additive manufacturing, in which the planar structure includes grounding wires 21. In some embodiments, power wires/planes may be substituted for the grounding wires. The initial wiring structure may be printed using additive manufacturing as described with reference to FIGS. 1-9. Planar cutouts can manufactured around the signal wires 12 and ground wires 21, which can be connected to the planes. In some embodiments, because the plating process occurs on the outside of the plane surface, the electrical signal will travel around the outer conductive layer and not through its bulk, as it would in a traditional interposer or printed circuit board. To reduce the mean free path of the current, secondary cutouts can be made in the plane to reduce the mean free path of the current.

Figure 11:
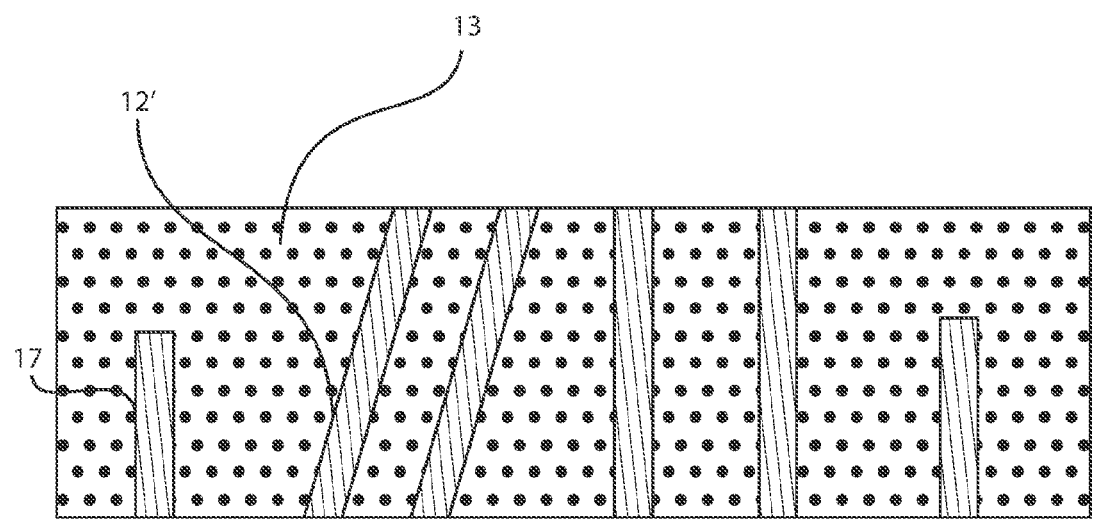
FIG. 11 is a side cross-sectional view depicting signal wires in combination with grounding wires extending into a dielectric material that are formed using additive manufacturing.
Figure 12:
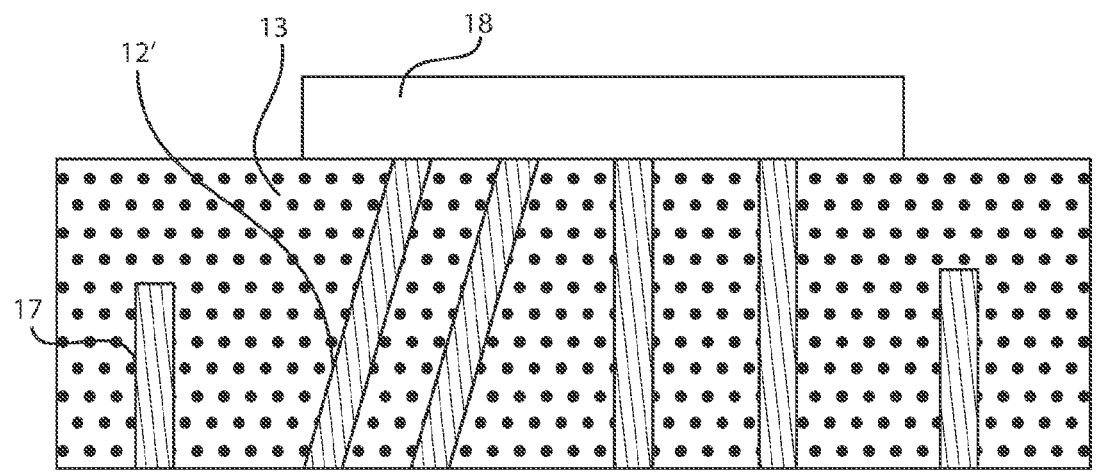
FIG. 12 is a side cross-sectional view depicting forming a photoresist mask atop the structure depicted in FIG. 11.
Figure 13:
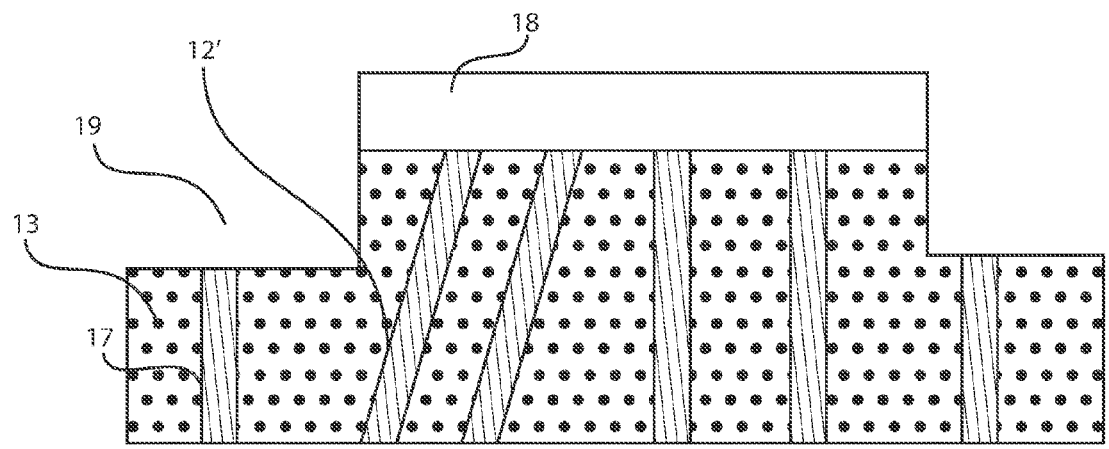
FIG. 13 is a side cross-sectional view of etching the structure depicted in FIG. 12 to provide trenches for forming planes to the grounding wires.

Referring to FIGS. 11-14, in another embodiment, continuing with the process flow described with reference to FIGS. 1-9, photolithography methods can be used to develop power and ground planes 17 on the outer surface. The example depicted in FIGS. 11-13 illustrates a structure with initially shorter ground wires 17 and then excess material is being removed. Alternatively, the wires, e.g., metal interconnect wires 12' and ground wires 17 could all be the same length and then the resin is etched revealing the ground/power wires. The plane would then be deposited around the revealed wires. In the embodiment depicted in FIGS. 11-13, the planes are being manufactured on the top of the trace/via hybrid structure. This can be beneficial for grounding planes. For power planes, the same type of structure could be manufactured on the bottom of the trace/via hybrid structure.

FIG. 11 depicting signal wires 12' in combination with grounding wires 17 extending into a dielectric material 13 that are formed using additive manufacturing. The structures depicted in FIG. 11 may be formed in accordance with the methods described with reference to FIGS. 1A-9.

FIG. 12 depicts one embodiment of forming a photoresist mask 18 atop the structure depicted in FIG. 11. The photoresist mask 18 is formed using photolithography and development processes to cover the signal wires 12', while leaving the portion of the dielectric material 13 overlying the grounding wires 17 exposed.

FIG. 13 depicts etching the structure depicted in FIG. 12 to provide trenches for forming planes to the grounding wires 17. The etch process may be an anisotropic etch, such as reactive ion etch (RIE). In another embodiment, the etch process could be a laser etch. The etch process may continue to remove dielectric material 13 until an upper surface of the grounding wires 17 are exposed. The etch process may be timed or terminated using end point detection.

Figure 14:
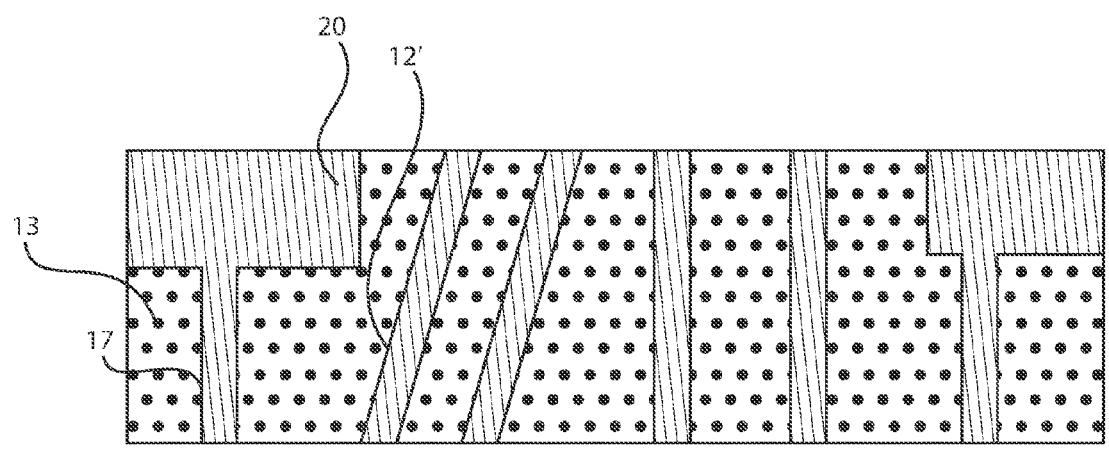
FIG. 14 is a side cross-sectional view depicting one embodiment of filling the trenches depicted in FIG. 13 with an electrically conductive material to form the planes to the grounding wires.

FIG. 14 depicts one embodiment of filling the trenches depicted in FIG. 13 with an electrically conductive material to form the planes 20 to the grounding wires 17. The planes 10 may be composed of a metal selected from the group consisting of copper, nickel, aluminum, tungsten, titanium, platinum, gold, tin, silver and combinations thereof. The metal may be deposited using physical deposition (PVD) processing, such as sputtering, or a plating process, such as electrolytic, electroless plating, and combinations thereof.

Figure 15:
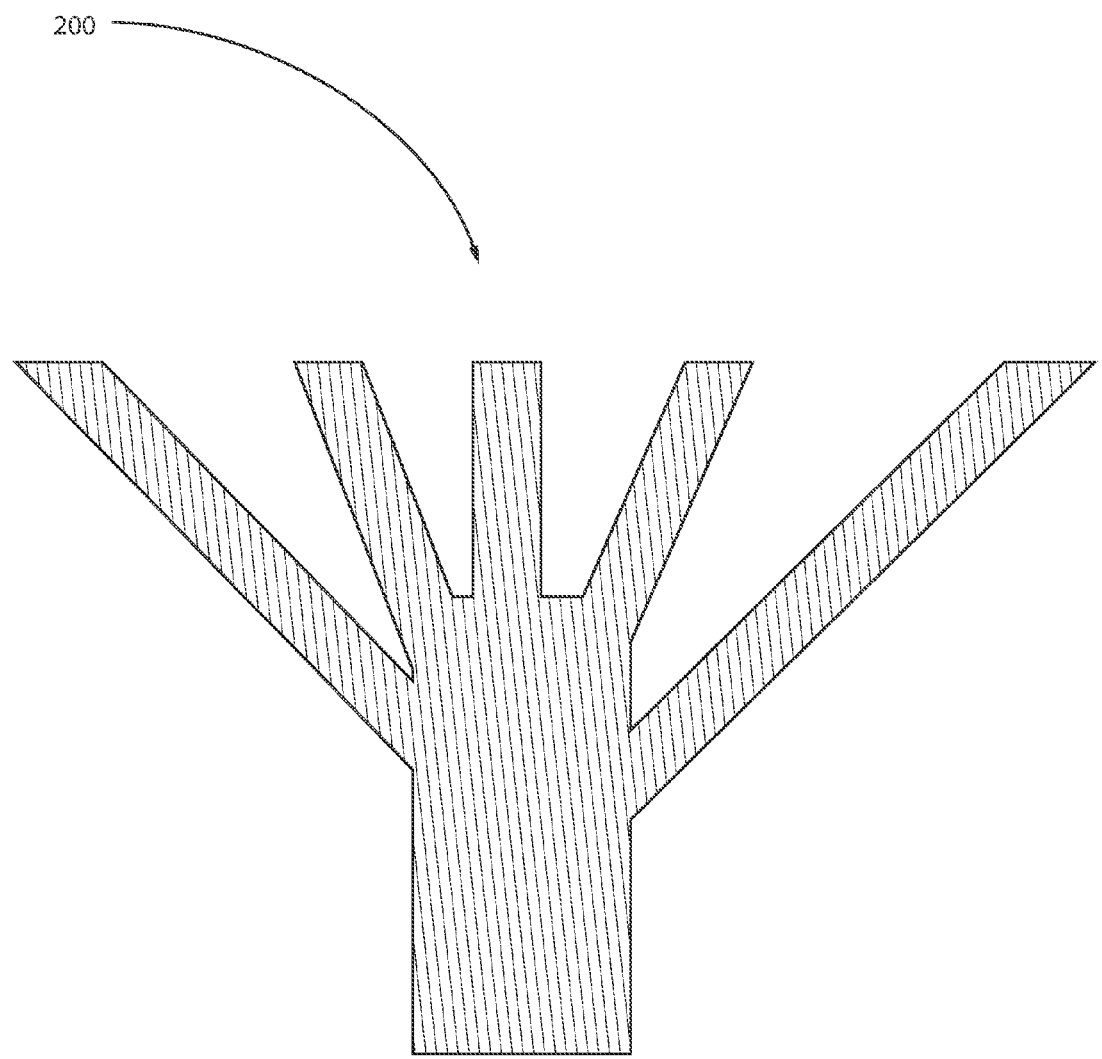
FIG. 15 is a side cross-sectional view depicting multiple ground and/or power wires being combined into a larger drain/source, in accordance with one embodiment of the present disclosure.

In another embodiment, the methods and structures for forming interconnects and electrical communication structures, as described with reference to FIGS. 1-9, can eliminate the need for planes all together and creates a "tree" like structure that allows for multiple ground or power wires to be combined into a larger drain/source 200, as depicted in FIG. 15.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of forming an interconnect comprising:
providing a sacrificial trace structure using an additive forming method, the sacrificial trace structure having a geometry for the interconnect;
forming a continuous seed metal layer on the sacrificial trace structure;
removing the sacrificial trace structure, wherein the continuous seed metal layer remains;
forming an interconnect metal layer on the continuous seed layer; and
forming a dielectric material on the interconnect metal layer to encapsulate a majority of the interconnect metal layer, wherein ends of said interconnect metal layer are exposed through one surface of the dielectric material to provide said interconnect extending into said dielectric material.

2. The method of claim 1, wherein the sacrificial trace structure is comprised of a polymeric material.

3. The method of claim 1, wherein the sacrificial trace structure is formed using a three dimensional additive method selected from the group consisting of stereolithography, self-propagating waveguide formation, fused deposition modeling (FDM), selective laser sintering (SLS), continuous liquid interface production (CLIP), digital light processing (DLP), material jetting, and combinations thereof.

4. The method of claim 3, wherein the continuous metal seed layer is composed of a metal selected from the group consisting of nickel, aluminum, copper, tantalum, titanium, platinum, tin, gold, and combinations thereof.

5. The method of claim 4, wherein the continuous metal seed layer is deposited using electroless plating.

6. The method of claim 1, wherein removing the sacrificial trace structure comprises dissolving the polymeric material.

7. The method of claim 1, wherein the interconnect metal layer is deposited using an electroplating process, physical vapor deposition, atomic layer deposition or chemical vapor deposition.

8. The method of claim 7, wherein the interconnect metal layer is composed of a metal selected from the group consisting of nickel, aluminum, copper, tantalum, titanium, platinum, tin and combinations thereof.

9. The method of claim 7, wherein the interconnects composed of the interconnect metal layer and the continuous metal seed layer have a solid core.

10. The method of claim 7, wherein the interconnects composed of the interconnect metal layer and the continuous metal seed layer have a hollow core.

11. The method of claim 1, wherein said forming the dielectric material on the interconnect metal layer to encapsulate the majority of the interconnect metal layer comprises:
deposition of the dielectric material by chemical vapor deposition, injection molding, transfer molding, or spin on deposition; and
planarization of the dielectric material to expose said ends of said interconnect metal layer.

* * * * *